(12) United States Patent
Lauffer et al.

(10) Patent No.: US 6,542,379 B1
(45) Date of Patent: Apr. 1, 2003

(54) CIRCUITRY WITH INTEGRATED PASSIVE COMPONENTS AND METHOD FOR PRODUCING

(75) Inventors: John M. Lauffer, Waverly, NY (US); David J. Russell, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/353,992

(22) Filed: Jul. 15, 1999

(51) Int. Cl.⁷ .............................. H05K 1/16; H05K 3/30
(52) U.S. Cl. ...................... 361/793; 361/761; 361/762; 361/763; 361/782; 361/792; 361/795; 174/260; 336/200; 428/209; 428/213; 428/215; 428/216; 29/832; 29/846; 29/854
(58) Field of Search ............................ 361/306.1, 306.2, 361/306.3, 311–313, 734, 738, 739, 780, 761–766, 792–795; 174/250, 266, 255–258, 262–264; 257/678, 691, 700–702, 723, 724; 336/200, 223, 225, 232; 338/254, 320, 309–311; 428/209, 213, 215, 216, 901; 29/25.41, 25.42, 602.1, 604, 605, 610.1, 620, 830, 831, 832, 846, 852, 854

(56) References Cited

U.S. PATENT DOCUMENTS

| | | | |
|---|---|---|---|
| 4,566,186 A | | 1/1986 | Bauer et al. .................. 29/852 |
| 4,604,160 A | * | 8/1986 | Murakami et al. ............ 29/846 |
| 4,889,790 A | | 12/1989 | Roos et al. ................. 439/258 |
| 4,992,354 A | | 2/1991 | Axon et al. ................. 430/258 |
| 4,999,740 A | | 3/1991 | Ilardi et al. ................. 361/386 |
| 5,227,012 A | * | 7/1993 | Brandli et al. .............. 428/209 |
| 5,239,448 A | | 8/1993 | Perkins et al. .............. 361/764 |
| 5,262,280 A | | 11/1993 | Knudsen et al. ............ 430/312 |
| 5,334,487 A | | 8/1994 | Kindl et al. ................ 430/312 |
| 5,366,846 A | | 11/1994 | Knudsen et al. ............ 430/280 |
| 5,371,029 A | | 12/1994 | Abdo et al. .................. 437/51 |
| 5,485,038 A | | 1/1996 | Licari et al. ................. 257/758 |
| 5,501,941 A | | 3/1996 | Ngo ....................... 430/270.15 |
| 5,599,655 A | | 2/1997 | Ngo ............................ 430/325 |
| 5,599,747 A | | 2/1997 | Bhatt et al. .................. 437/209 |

(List continued on next page.)

FOREIGN PATENT DOCUMENTS

| | | | | |
|---|---|---|---|---|
| CA | 2246405 | | 6/1998 | ............ H05K/1/18 |
| DE | 2 231 614 A | | 1/1974 | |
| EP | 0 574 206 A2 | | 12/1993 | ............ H05K/3/46 |
| GB | 206 006 B | | 10/1987 | |
| GB | 218 816 B | | 4/1999 | |
| JP | 02 154496 A | | 6/1990 | ............ H05K/1/16 |
| JP | 05 283866 A | | 10/1993 | ............ H05K/3/46 |
| WO | WO 99/41019 A | | 8/1999 | ............ B05D/5/12 |
| WO | WO 01/06818 A1 | | 7/2000 | |

OTHER PUBLICATIONS

The Illustrated Dictionary of Electronics (6ᵗʰ edition), by Stan Gibilisco, publ. by TAB Books, 1994: pp. 176 and 350.*

(List continued on next page.)

*Primary Examiner*—David L. Talbott
*Assistant Examiner*—John B. Vigushin
(74) *Attorney, Agent, or Firm*—James A. Lucas; Driggs, Lucas, Brubaker & Hogg Co., LPA

(57) ABSTRACT

Passive electrical components such as capacitors, resistors, inductors, transformers, filters and resonators are integrated in to electrical circuits utilizing a process which maximizes the utilization of the planar surfaces of the substrates for high density placement of active components such as logic or memory integrated circuits. The passive components are integrated into a conventional circuit board utilizing a photoimageable dielectric material. The dielectric is photoimaged and etched to provide one or more recesses or openings for the passive devices, and photovias interconnecting the inputs and outputs of the integrated circuit board. The electronic structure comprising at least one of the passive devices integrated into a photoimaged dielectric is described as well as the method of manufacturing the same.

24 Claims, 4 Drawing Sheets

U.S. PATENT DOCUMENTS

| | | | |
|---|---|---|---|
| 5,612,660 A | | 3/1997 | Takimoto ................... 336/200 |
| 5,623,160 A | * | 4/1997 | Liberkowski ............... 257/700 |
| 5,635,761 A | * | 6/1997 | Cao et al. .................... 257/700 |
| 5,643,657 A | | 7/1997 | Dueber et al. ............. 428/209 |
| 5,648,200 A | | 7/1997 | Letize et al. ................ 430/315 |
| 5,665,650 A | | 9/1997 | Lauffer et al. ................ 216/20 |
| 5,691,395 A | | 11/1997 | Knudsen et al. .............. 522/31 |
| 5,700,607 A | | 12/1997 | Rath et al. .................... 430/15 |
| 5,707,782 A | | 1/1998 | Economy et al. ........ 430/285.1 |
| 5,709,979 A | | 1/1998 | Casson et al. ............. 430/311 |
| 5,721,088 A | | 2/1998 | Martin et al. ............ 430/270.1 |
| 5,724,232 A | | 3/1998 | Bhatt et al. ................. 361/762 |
| 5,796,587 A | * | 8/1998 | Lauffer et al. ............. 361/763 |
| 6,008,102 A | * | 12/1999 | Alford et al. ................ 336/200 |
| 6,147,876 A | * | 11/2000 | Yamaguchi et al. ........ 361/766 |
| 6,169,320 B1 | * | 1/2001 | Stacey ........................ 336/200 |
| 6,194,990 B1 | * | 2/2001 | Lee et al. .................... 338/320 |
| 6,225,570 B1 | * | 5/2001 | Ishiyama et al. ........... 361/762 |
| 6,229,098 B1 | * | 5/2001 | Dunn et al. ................. 174/255 |

OTHER PUBLICATIONS

International Search Report dated Oct. 16, 2000 re Application No. PCT/GB 00/02679, filed Jul. 13, 2000.

IBM Technical Disclosure Bulletin vol. 36, No. 10. Oct. 1993, "Polymer Resistor Formation in Photo Via", p. 349.

"Surface Laminar Circuit Packaging", by Y. Tsukada et al, Proceedings of the $42^{nd}$ Electronics Components & Technology Conference, May, 1992, pp. 22–27.

"Multichip Modules", ICEMM Proceedings '93, Apr. 14–16, 1993, vol. 1986, pp. 435–440.

Hungarian Search Report re Application P 0202178.

International Search Report re Application PCT/GB 00/02679.

* cited by examiner

CIRCUITRY WITH INTEGRATED PASSIVE COMPONENTS AND METHOD FOR PRODUCING

BACKGROUND OF THE INVENTION

1. Field of the Invention

This invention pertains generally to high density surface laminar circuitry containing embedded or integrated passive components such as resistors, capacitors, transformers and inductors.

2. Description of Related Art

Surface Laminar Circuitry™ (SLC) technology provides a significant advantage in its ability to provide high density electronic packaging. The primary advantage is due to the microvias which allow high density interconnect capability between different wiring layers. The use of microvias provides more open area for wiring of circuits, as the area is not consumed by large diameter drilled PTHs (plated through holes) and their associated, large diameter lands and clearance lands.

Electronic packaging requires the interconnection of hundreds and even thousands of different devices. The primary, or active, devices consist of integrated circuits (ie. logic or memory integrated circuits). Proper functioning of each active device requires the addition of passive devices (resistors, capacitors, transformers and inductors) to properly modify the signals into and out of the integrated circuit. These passive devices in today's electronic packages consume a large percentage of the surface real estate that might otherwise be available for even higher circuit densities.

Soldering of discrete components on the surface(s) of the board uses much of the potential wiring real estate for placement of these components. Integration of the passive components provides more real estate for high density wiring, and also provides improved performance due to the closer proximity of the passive devices to the integrated circuits. In the past, this problem has been solved by packaging the passive components as discrete components (pin in hole or surface mount) and soldering them onto the circuit board.

SUMMARY OF THE INVENTION

It is an objective of the present invention to have an electronic package that is able to utilize the full high density wiring capability of the Surface Laminar Circuitry™ technology.

Another objective is to increase the circuit density, provide simpler signal routing, reduce the number of plated through-hole and solder joints, reduce assembly costs and enhance electrical performance.

The Surface Laminar Circuitry™ structure with integrated passive components and method for producing the structure as hereafter disclosed will provide this capability.

These and other objectives are achieved in accordance with the present invention as follows.

A high density electronic package comprises a substrate having an electrically conductive layer, preferably of copper foil and an imageable dielectric material on the electrically conductive layer and providing at least one generally planar surface. The dielectric material preferably has a dielectric constant of about 5.0 or less. Typically, it comprises an epoxy containing an imageable substance incorporated therein. At least one active device comprising an integrated circuit is mounted on said generally planar surface. At least one passive device selected from the group consisting of one or more resistors, capacitors, transformers, inductors and combinations thereof is integrated into the dielectric material in electrical communication with the at least one active device.

In another aspect of the invention, a method of producing a high density electronic package is described. The package is composed of an imageable dielectric material having at least one planar surface, at least one active device mounted on said surface and at least one passive device integrated into the surface of the dielectric material and electrically joined to the active device. The method comprises the steps of applying a thin layer of an imageable dielectric material over a circuit pattern; imaging a pattern for said passive device on the surface of the dielectric material to create at least one recess in the surface of the dielectric material; and filling the recess with a material having the requisite properties of the passive device. The imageable dielectric material is one that can be imaged by light, laser, plasma or other similar means. At least one, but preferably a plurality of passive devices having the same or different characteristics and capacities can be integrated into the dielectric material. These may include decoupling or in-circuit capacitors, resistors, transformers and inductors.

The invention relates to a circuit structure comprising a substrate including a first conductive layer of a suitable metal such as a foil or electrodeposit of copper, a layer of a photoimaged dielectric material over the first conductive layer, and a second conductive layer of a metal such as copper over the dielectric. The dielectric includes at least one passive device, and a plurality of photovias electrically joining the two conductive layers. The passive device is selected from the group consisting of capacitors, resistors, inductors and transformers. When the passive device is a capacitor device, the first conductive metal layer contains a circuit pattern defined therein and is electrically joined through the photovias to a circuit pattern defined in the second conductive metal layer. A second portion of the first conductive layer is imaged in the pattern of a bottom capacitor and is electrically joined through one or more photovias to a second portion of the second copper layer imaged in the pattern of a top capacitor. When the passive device is a resistor, it is composed of an electrical resistor material disposed in a photoimaged opening in the dielectric material. The resistor is either coplanar with, or vertical to the dielectric layer. When the passive device is an inductor or a transformer, the first and second conductive metal layers each contain a plurality of parallel lines, and the photoimaged dielectric layer covers the parallel lines and contains a plurality of photovias that join the ends of the parallel lines in the first conductive layer with those in the second conductive layer. The dielectric contains a photoimaged opening or channel over a portion of the lines midway between their ends, and the opening contains a high permeability material to form an inductor. Alternatively, the first and second conductive layers contain a first row of parallel lines electrically joined to one another through the photovias to form a primary transformer winding, and a second row of lines electrically joined in a similar manner to form a secondary winding. The high permeability material in the photoimaged opening in the dielectric comprises a ferrite core which cooperates with the primary and secondary windings to form a transformer.

The invention also relates to an electronic structure comprising one or more passive devices such as inductors, capacitors, resistors or transformers integrated into the imaged surface of an imageable dielectric material. The surface is imaged to create one or more recesses or openings shaped to receive each of the passive devices.

DETAILED DESCRIPTION OF THE INVENTION

Figure 1A:
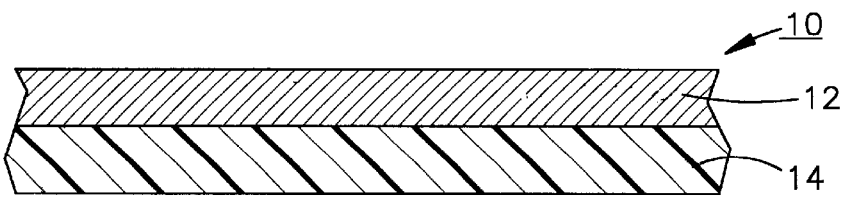
FIGS. 1A–1G show the sequential steps for the integration of a capacitor into the subcomponent structure of an integrated circuit.
Figure 1B:
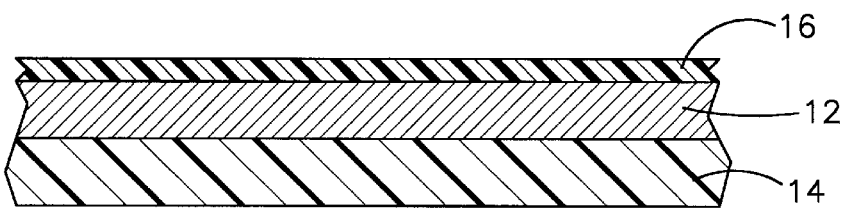
Figure 1C:
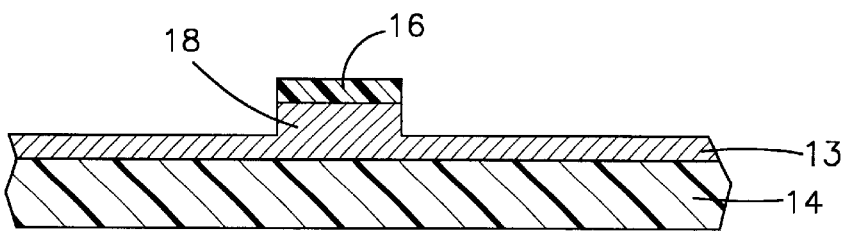

The Surface Laminar Circuitry™ package of this invention provides for very high density electronic packaging by first providing high density wiring and interconnect capabilities of the base Surface Laminar Circuitry™ technology, and secondly, by integrating passive electronic component functions with the package. In integrating the passive component function, Surface Laminar Circuitry™ processing techniques are utilized to provide high precision passive components. Although the integrated passive components (resistors, capacitors, transformers and inductors) are described individually, it will be obvious to one skilled in the art, that each of these devices can be integrated into a single multilayer Surface Laminar Circuitry™ electronic package.

Surface Laminar Circuitry™ technology consists of a conventional FR4 (glass-epoxy) type sub-composite circuit board. The sub-composite contains two or more circuit planes in signal or power configurations. The sub-composite may also contain plated thru holes that interconnect the various wiring layers. Plated through holes (PTHs) may be added as part of the final Surface Laminar Circuitry™ assembly.

Circuits are defined on the external surfaces of the sub-composite. A layer of photoimageable dielectric is then placed over these circuit layers, and interconnect vias are imaged and developed from the dielectric. Next, an additional circuit layer is defined on the photoimageable dielectric by either full copper plating and etching or pattern plating, whereby this additional circuit is interconnected with the circuit below the plated photovias.

The above procedure of adding dielectric and circuit layers may be repeated sequentially until the desired circuit is completed.

Although the integrated passive component technologies are described herein in terms of photoimageable dielectric materials, the integrated passives are equally effective with other Surface Laminar Circuitry™ technologies such as laser or plasma defined vias, etc. Therefore, for purposes of the present invention, expressions such as 'photoimage' are intended to encompass these other technologies as well.

Integrated passive components are incorporated into the circuit structure in the following manner.

Decoupling or bypass capacitors are introduced into a circuit for the purpose of reducing high frequency noise that occurs during power switching. This type of capacitor is best integrated in a Surface Laminar Circuitry™ structure by using any of the various techniques known in the industry for incorporating it into the sub-composite structure. In this case, the sub-composite will include at least one power-ground plane sandwich, where the power and ground planes are in close parallel proximity to each other, with a thin dielectric between them. The dielectric material may be either a standard, thin FR4 material, or a modified material such that a higher dielectric constant is achieved.

The in-circuit capacitor is defined as a parallel plate type capacitor having a reduced thickness dielectric. This capacitor is produced in the Surface Laminar Circuitry™ structure as follows:

a) The sub-composite structure is defined with a 1.5 mil to 2.5 mil layer of a copper foil or the like. A photoresist is then applied to the external copper surfaces and imaged in a pattern of the bottom capacitor electrode; whereby after exposure and developing, the resist has been removed from the entire surface except for the features of the capacitor.

b) The sub-composite is then etched down using a Fluid Head™ or other uniform etchdown technique, such that the capacitor electrode portion remains unetched, and at its original thickness and the remaining copper is etched to a thickness of between about 0.5 mil and about 1 mil The photoresist material is then removed from the panel.

c) A second photoresist is applied over the etched copper surface and a circuit pattern defined by etching in the previously etched copper. The, capacitor electrode is protected by the photoresist during this etch step, and d) A 2 mil to 3 mil layer of a photoimageable dielectric material is applied over the surface of the etched sub-composite. In a first embodiment of the in-circuit capacitor, the sub-composite structure with photoimageable dielectric is pressed at a sufficient temperature and pressure to planarize the photoimageable dielectric, resulting in a structure having a uniform 1.5 mil to 2.5 mil dielectric thickness over the circuits, but a 0.2 mil to 1 mil-thick dielectric over the thicker capacitor. Photovias are then defined in the dielectric material by exposing and developing, and then curing the dielectric material. A second copper circuit layer and top capacitor-electrode is then defined-over the cured photoimageable dielectric, using standard Surface Laminar Circuitry™ processes.

In a second embodiment of the in-circuit capacitor, the photoimageable dielectric is via imaged and developed. In addition to via imaging, a window surrounding the bottom capacitor is also developed away, leaving the bottom capacitor electrode exposed. In this embodiment, a second dielectric material is then applied directly over the bottom capacitor electrode using screen or stencil printing, extrusion or injection techniques. This second dielectric material may be a standard thermoset or thermoplastic resin, but is preferably modified to result in an elevated dielectric constant. A preferred modification is by the addition of a barium titanate, or similar, particulate filler to the resin. This second dielectric is then planarized, as required, by pressing flat, or grinding off any raised areas, either before or after curing. A second copper circuit layer and top capacitor electrode is then defined over the bottom capacitor and the cured dielectric materials, using standard SLC processes.

A precision resistor from approximately one ohm to 100 Mohm is defined in the Surface Laminar Circuitry™ structure according to the present invention using the following methods:

A sub-composite copper layer is etched in a pre-defined circuit pattern. A photoimageable dielectric is applied over the etched pattern and imaged with both a photovia and resistor pattern. The resistor pattern may be a simple square or rectangular opening, or it may be a more complex serpentine shape in the dielectric. This shape will depend on the targeted. resistor value. After the dielectric is processed and cured, there will be a defined resistor opening which has precise length, width and thickness dimensions.

A resistor material is then deposited into the resistor opening. This application is by screen or stencil printing, extrusion injection, or other suitable techniques. The resistor material is one of any of the materials commercially available from suppliers such as I.E. Dupont, EMCA-Remex, W.R. Grace, Rohm and Haas, and others typically referred to as Polymer Thick Film Resistor (PTFR) materials. These materials are typically thermoset resins that are filled with a carbon particulate material. The amount, type and shape of the filler will determine a specific sheet resistivity, or resistance per unit length and width, at a specified thickness. Different resistor materials are deposited in different openings in order to define a broad range of resistor values. The use of different materials, in conjunction with the various resistor shapes, allows for a wide range of resistor values to be defined. The precisely controlled length, width and thickness of the openings in the photoimageable dielectric enable precision resistors to be produced.

Following curing of the resistor material, any excess resistor material extending above the photoimageable dielectric material is ground away, leaving the resistor surface flush with the dielectric surface.

A second copper circuit layer and resistor terminations are then defined over the cured photoimageable dielectric and resistor materials, using standard Surface Laminar Circuitry™ processes. The copper resistor terminations are defined such that the copper partially overlaps and contacts two opposing ends of the resistor material, with the copper being separated over the body of the resistor material. In alternative embodiments, the copper terminations may be defined in the bottom (sub-composite) copper layer, Ni/Au plated terminations in both copper layers, or in alternative copper layers.

In another embodiment, specifically targeted for low value resistors, the resistor is oriented vertically by having a first termination on the sub-composite circuit, and a second termination on the Surface Laminar Circuitry™ copper layer. This resistor embodiment may also utilize the sub-composite copper etchdown technique to precisely control the resistor length.

An integrated inductor is fabricated by the following methods:

A series of parallel lines are etched in the sub-composite copper layer to provide one half of the inductor winding. The photoimageable dielectric is applied over the copper layer and is patterned such that the ends of the parallel circuit lines are covered by the dielectric. A photovia is also formed near each end of the circuit lines.

In a first embodiment for low value inductors, a second copper layer is applied over the cured dielectric, and a second set of parallel lines is defined in this copper layer. This second set of lines is arranged so that it connects thru the photovias to the first set of copper lines, thus creating a continuous winding thru the photovias, and around the photoimageable dielectric.

In a second inductor embodiment, in addition to photovia openings of the first embodiment, the photoimageable dielectric also contains an opening over a central portion of the copper lines. This opening is then filled with a high permeability material by screen or stencil printing, extrusion injection or other suitable techniques. The high permeability material is preferably a thermoset resin that has been heavily loaded with a powdered iron particulate. For example, an epoxy loaded with between 30% and 95%, preferably about 75% of powdered iron may be used. A second set of parallel copper lines in then defined over this high permeability material, as in the first embodiment, but now creating a continuous winding about the high permeability material. The second copper layer is preferably defined by plating copper circuit lines using a permanent photoresist material to insulate between these lines. Because of the high permeability core material used in this embodiment, achievable inductance values are significantly greater than those of the first embodiment.

For even greater inductance values, a third embodiment of the invention is made using a gapped core. This embodiment is very much like the second embodiment, except a narrow strip of imageable dielectric material is left in the opening for the high permeability material such that there is a built-in gap created in the structure, defined by the imageable dielectric.

The Surface Laminar Circuitry™ package constructed by any of the aforementioned procedures, preferably contains one or more integrated circuit devices mounted on its external surfaces. For highest density packaging, the integrated circuits (IC) are preferably attached via flip chip C4 bonding. Back bonded, wire bonded, or plastic packaged IC's are also acceptable at lower packaging densities.

The IC I/Os are interconnected to other IC's and to the integrated passive devices by the Surface Laminar Circuitry™ circuit wires on one or more layers and on one or more surfaces of the base sub-composite. Any combination of passive components can be wired into the circuit including parallel or series connections of like passive devices, or parallel or series connections of different passive devices.

Figure 1D:
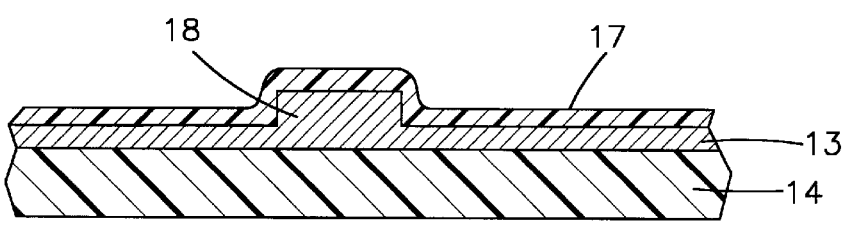

Referring now to the drawings, FIGS. 1A–1G show the sequential steps in forming an in-circuit capacitor according to the present invention. The first step shown in FIG. 1(A) involves forming a sub-composite laminate 10 of a 1.5 to 2.5 mil layer of copper 12 on a planar surface of a substrate 14. A first photoresist 16 is then applied over the copper layer [see FIG. 1(B)] and is imaged in a pattern of a first or bottom capacitor electrode 18. The photoresist is then removed from the copper surface except for the capacitor. This is followed by etching using a Fluid Head™ or other suitable etchdown technique. The thickness of the etched copper preferably is between about 0.5 and about 1.0 mil while the thickness of the capacitor electrode 18 remains the same at about 1.5 to 2.5 mils. [see FIG. 1(C)]. A second photoresist 17 is then applied over the entire copper surface as shown in FIG. 1(D), and a circuit pattern is etched into the surface of the reduced thickness copper, with the bottom capacitor electrode 18 being protected by the photoresist 17 during etching. A photoimageable dielectric 20 is then applied over the etched surface of the subcomposite to a thickness of about 2 to about 3 mils.

In a first embodiment, the subcomposite is pressed to planarize the photoimageable dielectric to form a dielectric having a thickness of 1.5 to 2.5 mils over the circuit pattern and a 0.2 to 1 mil dielectric over the capacitor electrode. Photovias are then produced in the dielectric material by exposing and developing the dielectric. A second copper circuit layer and a top capacitor electrode are then defined over the cured photoimageable dielectric.

Figure 1E:
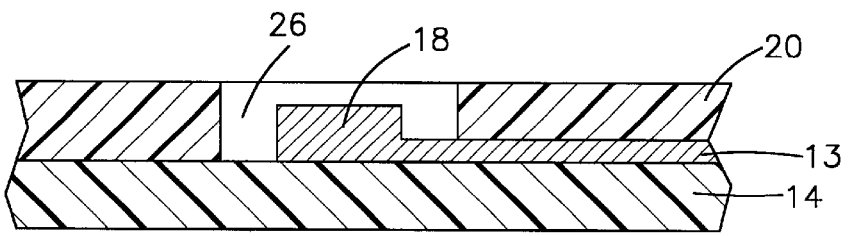
Figure 1F:
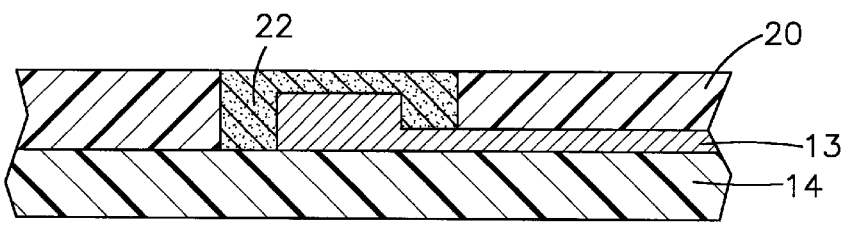
Figure 1G:
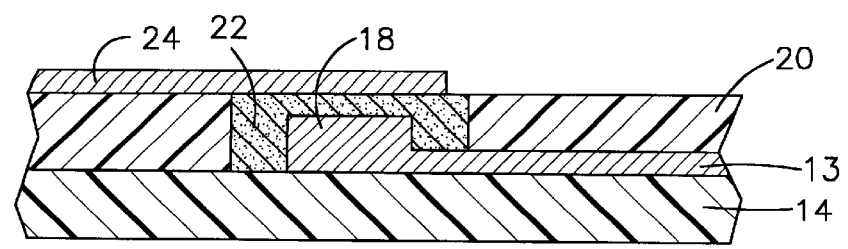

In a second embodiment shown FIG.1(E), a window 26 is formed surrounding the bottom capacitor electrode 18 as the photovias are imaged and developed. As noted in FIG. 1(F), the window 26 is filled with a second dielectric 22 applied over the bottom capacitor electrode 18 by conventional means. The second dielectric 22 is modified to have a higher dielectric constant than that of the first dielectric, and is planarized by pressing flat or grinding before or after curing. A second copper circuit layer 24 is applied as before.[See FIG. 1(G)].

Figure 2A:
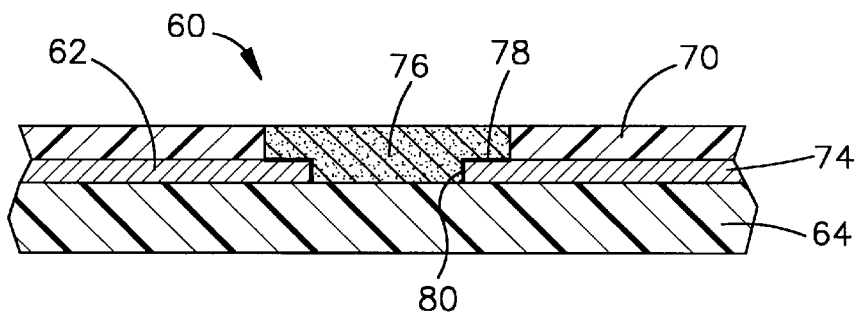
FIGS. 2A–2C show various embodiments for the integration of a resistor into a subcomponent structure.
Figure 2B:
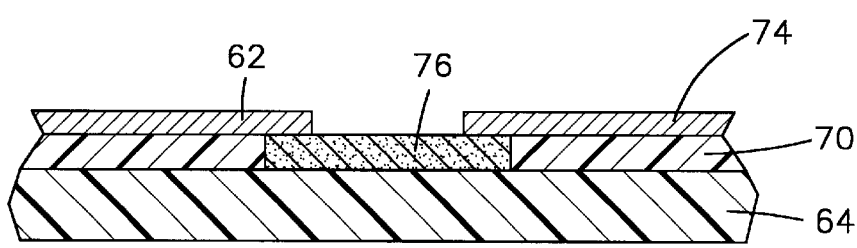
Figure 2C:
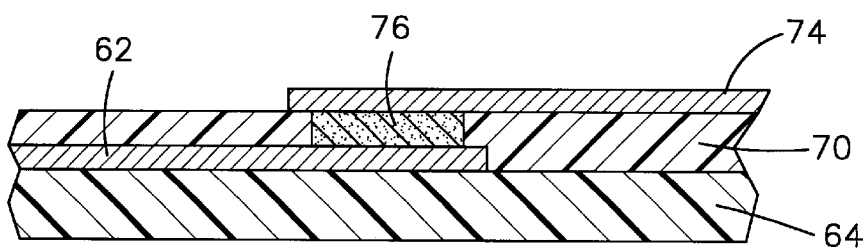

Turning now to FIGS. 2A–2C three different arrangements for connecting an integrated resistor and the electrical conductors are shown. In the first arrangement, shown in FIG. 2(A), a subcomposite laminate 60 comprises a first copper conductor 62 and a second copper conductor 74 on a substrate 64. The copper is etched into a predefined circuit pattern. A layer of a photoimageable dielectric 70 is applied over the etched surface and is imaged with photovias and a resistor pattern. Processing and curing of the dielectric gives a resistor opening having precise dimensions for the resistor. The width of the opening in the dielectric is shown as being wider than the spacing between the two conductors 62 and 74, thereby forming a step 78 on either side. A material 80 such as a nickel/gold alloy may be plated or otherwise applied to the step 78 to provide interface stability along the ends of the resistor 76 particularly when a polymer thick film resistor (PTFR) is used. A resistor material as previously described is then loaded into the resistor opening and is cured to form the resistor 76. Any excess resistor material is removed before or after curing. The nickel/gold alloy provides good electrical contact between the resistor and the conductors 62 and 74.

In FIG. 2(B), a layer 70 of a photoimageable dielectric is applied over the substrate 64 and is photoimaged to form a defined opening for the resistor material. As before, the resistor material is loaded into the opening and is cured to form the resistor 76 Electrical conductors 62 and 74 are laminated over the dielectric layer 70 partially overlying and in electrical contact with the resistor 76.

FIG. 2(C) shows yet another arrangement wherein a first conductor 62 is sandwiched between the substrate 64 and the resistor 76 with one end of the conductor in electrical contact with the resistor. The resistor is formed by loading a resistor material into an opening previously photodefined in the photoimageable dielectric 70. The second conductor 74 is laminated on the top surface of the resistor 76 and the dielectric 70 with one end in contact with the resistor.

Figure 3:
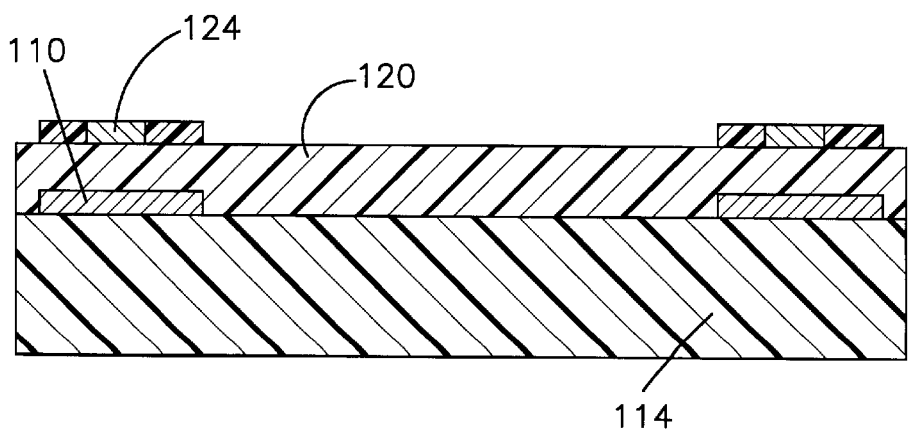
FIG. 3 is an elevational view in cross-section of a sub-component structure with an inductor integrated into the structure.
Figure 4A:
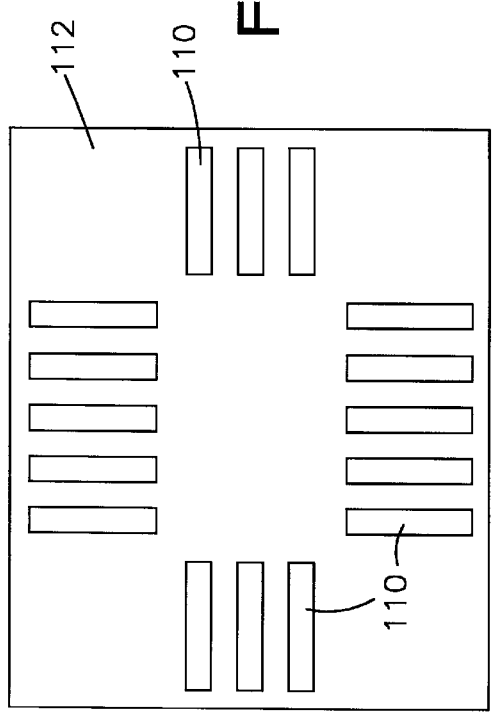
FIGS. 4A–4D show sequential steps for the assembly of an inductor in a subcomponent-assembly.
Figure 4B:
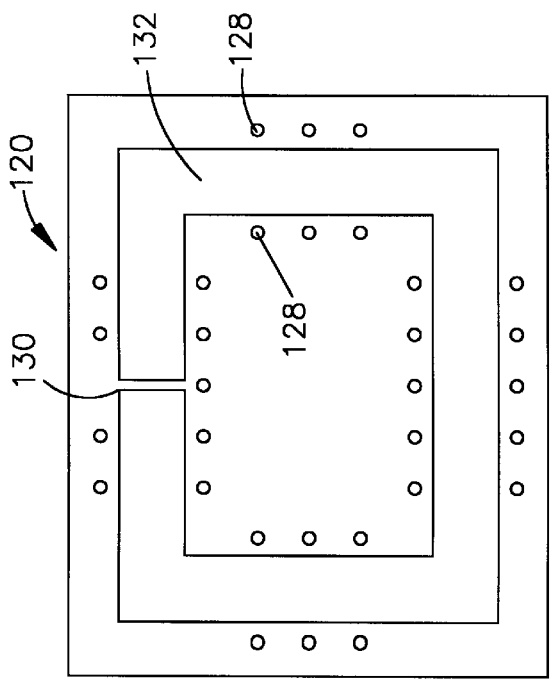
Figure 4C:
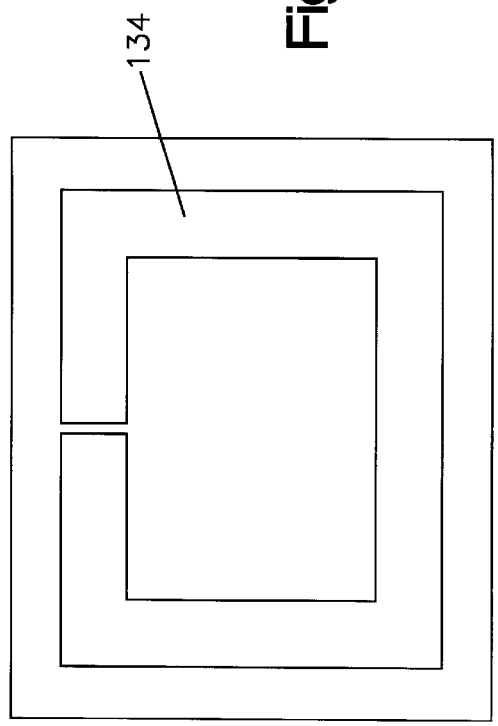
Figure 4D:
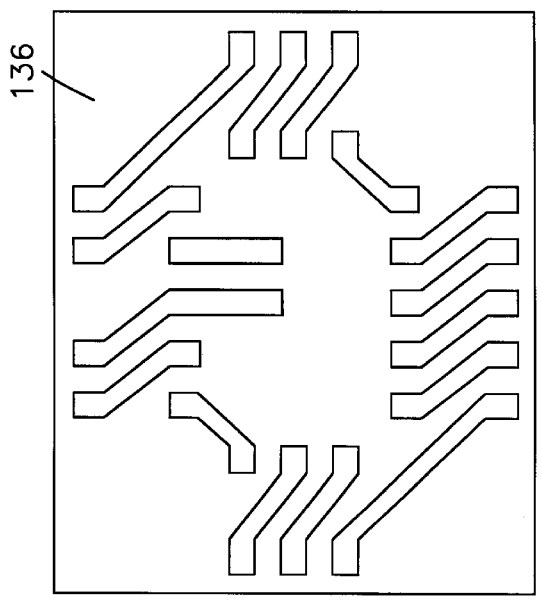
Figure 5:
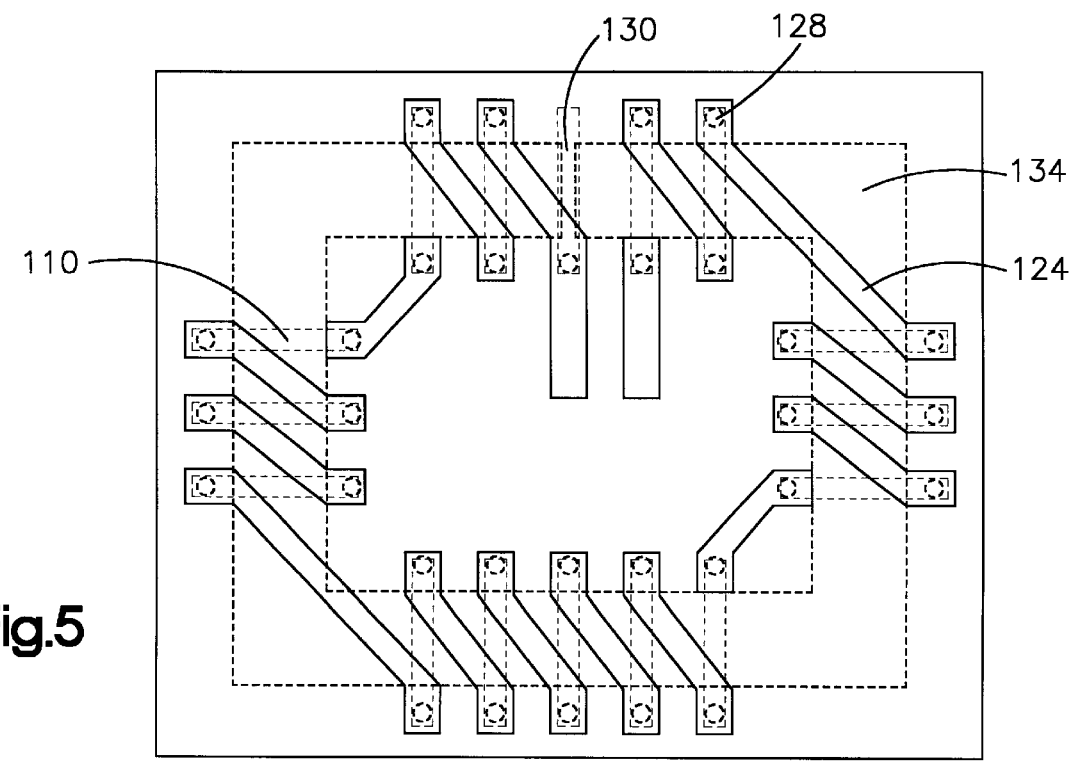
FIG. 5 is a top planar view of a subcomponent assembly including an inductor.

FIG. 3 is an elevational view taken as a cross section through FIG. 5 showing an inductor integrated into a high density circuit structure. The steps for producing the structure are shown sequentially in FIGS. 4(A) through 4(D).

FIG. 4(A) shows a pattern of parallel conductive wires 110 etched in the surface of a conductive copper layer 112 on top of the substrate 114 to form a bottom circuit. FIG. 4B show a layer of an imageable dielectric 120 which is suitably imaged to produce a plurality of via holes 128 communicating with the wires 110 shown in FIG. 4A. A core gap 130 may be formed in the dielectric 120 to increase the inductance of the device. A channel 132, extending to the bottom circuit, is formed in the dielectric by the imaging. The channel 132 is then filled with a suitable ferroelectric material to form a ferroelectric core 134 shown in FIG. 4C. A circuitized copper layer 136 having a plurality of parallel conductive wires 124 etched therein is laid over the dielectric to form the top circuit. The ends 126 of the wires 124 overlie the photovias (shown as 128 in FIGS. 4B and 5) to form electrical connections with the lower wires.

Figure 6:
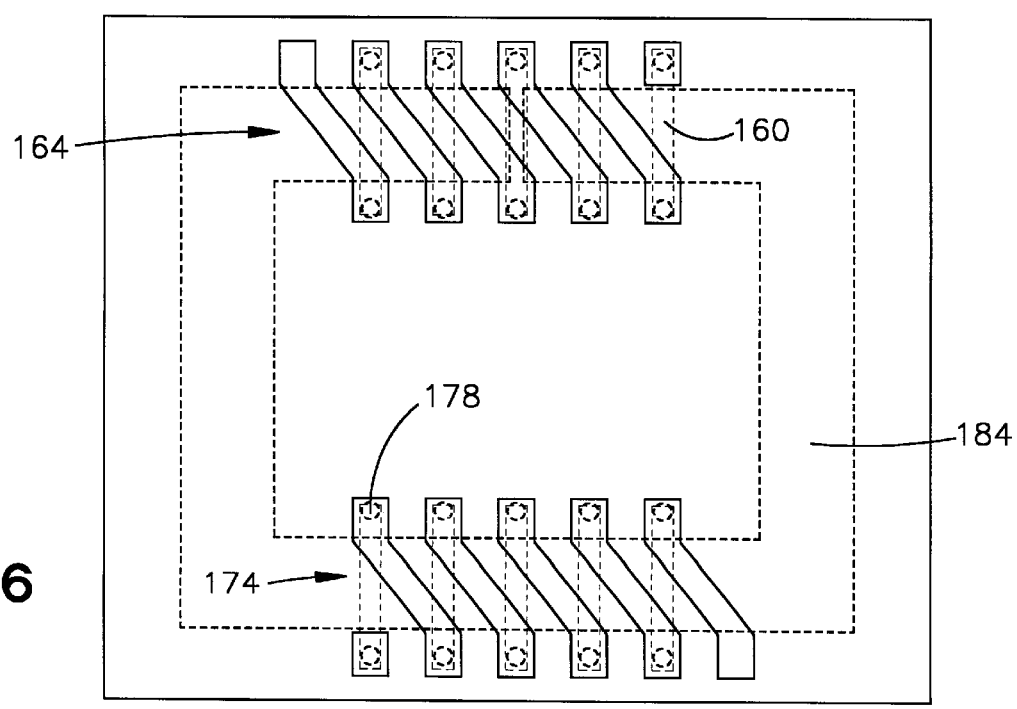
FIG. 6 is a top planar view of a subcomponent assembly including a transformer.

Turning now to FIG. 6, there is shown a configuration wherein the passive device comprises a transformer integrated into the dielectric layer. The device is prepared in a manner similar to that used to produce an integrated inductor. A pattern of parallel conductive wires 160 is etched in the copper surface on a substrate (not shown). The etched wires on the copper layer form the bottom circuit of the device. A dielectric layer is deposited over the bottom circuit, and includes a core channel. Into this core channel is placed a ferrite core 184. The transformer comprises first set of secondary windings 164 and second set of secondary windings 174 surrounding the core 184. Instead of a powdered iron/epoxy mix, the core is made of a powdered ferrite material in an epoxy or other thermosetting resin binder. A circuitized copper layer having parallel conductive wires 174 etched therein is laid over the dielectric and the core, with the ends of the wires overlying photovias 178 to form two sets of electrical connections with the windings 164, 174 and the lower wires 160.

Photoimageable dielectric materials that are suitable for use in connection with the teachings of the present invention are Advanced Solder Mask available from IBM Corporation also commercially available as DynaVia 2000™ from Morton, Probelec™ from Ciba Geigy Corporation, and ViaLux 81™ and Vacrel™, both available from E.I. DuPont de Nemours & Co. The dielectric material is applied by a suitable process such as screen printing, dipping, brushing, spray application, or vacuum, or by hot roll lamination of a dry film material according to conventional techniques. The photoimageable dielectric is exposed to a suitable source of radiation such as ultraviolet light through a preformed mask or grid to block the light from selected areas of the coating thereby forming the defined pattern. The coating is then developed with a developer such as butyrolacetone or propylene carbonate to remove the unexposed material from the coating to form the voids for the passive components.

The copper foil layer is then laminated over the dielectric which has preferably been partially cured by heating at 125° C. for approximately 30 minutes to prevent flow during the lamination. Lamination is achieved by hot rolling followed by a curing bake at 185° to 200° C. for 2 hours or by heating the same in a lamination press. Alternatively, the copper may be electrolessly or electrically plated on the surface of the fully cured, imageable dielectric layer. Copper plating may be full panel, followed by subtractive circuitization, or pattern plated in the form of the top circuit layer.

The electrically conductive material is circuitized using conventional photoresist or subtractive etching processes to form defined circuit patterns.

This unique interconnection capability of the invention provides for precise tailoring of signals into and out of the IC. In addition, the fact that all passive components are now in close proximity to the IC's, the overall circuit performance is greatly enhanced. Other advantages include a reduction in the number of solder joints, drilled holes and component parts, along with the overall costs of assembly.

Although the integrated passive components are described above as being formed as part of the Surface Laminar Circuitry™ layers, the same integrated passive component techniques, or other integrated passive component techniques, may also be used on layers of the sub-composite structure, such that the finished Surface Laminar Circuitry™ structure has integrated passive components as part of the sub-composite circuitry, as part of the Surface Laminar Circuitry™ layers, or both.

Additionally, the Surface Laminar Circuitry™ package may contain only one integrated passive component, or only one type of integrated passive component, either as part of the sub-composite or Surface Laminar Circuitry™ layers to fit the scope of this invention. The Surface Laminar Circuitry™ package described above, that contains at least one integrated passive component, may also include at least one discrete passive component that is soldered on its' surface, or in a plated-through hole. The package may contain passive components arranged to function as a resonator or filter for the integrated circuitry.

Instead of dielectrics that are imaged by photoimaging, other suitable dielectrics capable of being imaged by laser beam or plasma technologies may be used. Any dielectric having the requisite electrical values, and being capable of being imaged with a high degree of precision may be used in the teachings of the present invention.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A circuit structure comprising:
   a) a substrate including a first conductive copper layer;
   b) a layer of a photoimaged dielectric material over the first conductive copper layer, the dielectric material including at least one passive electrical device;
   c) a layer of a second conductive copper layer over the layer of dielectric material; and
   d) a plurality of photovias electrically joining the first conductive layer to the second conductive layer.

2. The circuit structure according to claim 1 including a capacitor device in which a first portion of the first copper layer contains a circuit pattern defined therein and is electrically joined through one or more photovias to a circuit pattern defined in the second copper layer, and a second portion of the first copper layer is imaged in the pattern of a bottom capacitor electrode and is electrically joined through one or more photovias through the layer of photoimaged dielectric material to a second portion of the second copper layer imaged in the pattern of a top capacitor electrode.

3. The circuit structure according to claim 2 wherein the photoimaged dielectric material over the bottom capacitor electrode has a higher dielectric constant than that of the remainder of the photoimaged dielectric layer, and the top capacitor electrode is positioned immediately above the portion of the dielectric material having the higher dielectric constant.

4. The circuit structure according to claim 3 wherein barium titanate particles are included in the dielectric material having the higher dielectric constant.

5. The circuit structure according to claim 1 including a resistor structure wherein the layer of photoimaged dielectric material contains an opening therein, and a quantity of electric resistor material is disposed in the opening.

6. The circuit structure according to claim 5 wherein the second copper layer is in electrical contact with the resistor material in the opening.

7. The circuit structure according to claim 6 wherein the resistor material in the opening comprises a precision resistor having a resistance in the range of between about 1 ohm and about 100 Mohms.

8. The circuit structure according to claim 5 wherein the resistor structure is coplanar with the dielectric layer.

9. The circuit structure according to claim 5 wherein the resistor structure is oriented generally orthogonal to the plane of the dielectric layer.

10. The circuit structure according to claim 1 wherein the first copper layer contains a plurality of parallel lines; the photoimaged dielectric layer covers the parallel lines and contains a plurality of photovias; and the second copper layer contains a plurality of parallel lines, each end of which is connected through a photovia to a corresponding end of the parallel lines in the first copper layer.

11. The circuit structure of claim 10 wherein the parallel lines are etched into the surface of the copper layers.

12. The circuit structure of claim 11 wherein the dielectric layer contains a photoimaged opening over a portion of the copper lines midway between the ends thereof, and the opening contains a high permeability material, thereby forming an inductor.

13. The circuit structure according to claim 10 wherein the first copper layer contains first and second rows of parallel lines spaced from one another, the second copper layer contains first and second rows of parallel lines spaced from one another, the first row of lines in the first copper layer connected through photovias to the first row of lines in the second copper layer to form a first secondary winding and the second row of lines in the first copper layer connected through additional photovias to the second row of lines in the second copper layer to form a second secondary winding, and a transformer core is located between the first and second windings thereby forming a transformer.

14. The circuit structure according to claim 13 wherein the transformer core comprises a ferrite core.

15. A method of producing a high density electronic package composed of an imageable dielectric material having at least one planar surface, at least one active device mounted on said planar surface, and at least one passive device integrated into the dielectric material and electrically joined to the at least one active device, said passive device including at least one capacitor functioning as a decoupling capacitor or as an in-circuit capacitor, comprising the steps of:
   a) applying a layer of an imageable dielectric material over a circuit pattern;
   b) imaging a pattern for said at least one passive device on the surface of the dielectric material to create at least one recess in the surface of the dielectric material; and
   c) filling the said at least one recess with a material having the requisite properties of the passive device,
      said in-circuit capacitor prepared by applying a photoresist over a copper layer having an initial thickness of between about 1.5 mils and about 2.5 mils; exposing and developing the photoresist in a pattern of a first capacitor electrode; removing the photoresist from the entire copper surface except for the first capacitor electrode, etching the copper to a thickness of about 1 mil or less; applying a second photoresist over the copper; defining and etching a circuit pattern into the copper; removing the second photoresist; and applying the imageable dielectric material over the etched surface of the copper to a thickness of between about 2 and about 3 mils to form a sub-composite.

16. The method according to claim 15 including the additional step after filling the said at least one recess, of applying a layer of conductive material on the imaged surface of the dielectric material in electrical contact with the material in said at least one recess.

17. The method according to claim 15 wherein the formed sub-composite is pressed at a temperature and a pressure sufficient to reduce the thickness of the dielectric material to a value of between about 1.5 and about 2.5 mils over the circuit pattern and between about 0.2 and 1.0 mil over the first capacitor electrode; developing photovias in the imageable dielectric material, applying a second layer of copper over the surface of the imageable dielectric material, and forming a second capacitor electrode.

18. The method according to claim 15 wherein the imageable dielectric material is imaged and developed to form one or more vias and said at least one recess exposing the top surface of the first capacitor electrode, a second dielectric material having a higher dielectric constant than that of the imageable dielectric material is applied to the at least one recess over the exposed surface of the first capacitor electrode and is cured followed by applying a second copper layer as a top capacitor electrode over the cured imageable dielectric material.

19. The method according to claim 18 wherein the second dielectric material is a resin and the dielectric constant thereof is made higher than that of the imageable dielectric material by the addition of a particulate filler to the resin before curing.

20. A method of producing a high density electronic package composed of an imageable dielectric material having at least one planar surface, at least one active device mounted on said planar surface and at least one passive device integrated into the dielectric material and electrically joined to the at least one active device, wherein the at least one passive device is an integrated inductor, comprising the steps of a) applying a layer of an imageable dielectric material over a circuit pattern;

b) imaging a pattern for said at least one passive device on the surface of the dielectric material to create at least one recess in the surface of the dielectric material; and c) filling the said at least one recess with a material having the requisite properties of the passive device,
the method further including the steps of etching a first set of parallel lines into the surface of a first copper layer to form one half of the windings of the inductor, applying the imageable dielectric material over the first set of parallel lines, developing a pattern in the said dielectric material to form photovias near each end of the first set of parallel lines, etching a second set of parallel lines in the surface of a second copper layer, and connecting the second set of parallel lines through the photovias to the first set of parallel lines.

21. The method according to claim 20 wherein the imageable dielectric material is patterned to create at least one recess over a portion of the copper lines between the two ends of the first set of parallel lines; the at least one recess is filled with a high magnetic permeability material, following which the second set of parallel lines in the second copper layer are connected to the first set through the photovias.

22. The method according to claim 21 wherein a gap in the high permeability material is formed by leaving a small strip of the imageable dielectric material therein.

23. The method according to claim 21 wherein the imageable dielectric material is imaged by a procedure selected from the group consisting of photoimaging, laser imaging and plasma imaging.

24. A method of producing a high density electronic package composed of an imageable dielectric material having at least one planar surface, at least one active device mounted on said planar surface and at least one passive device comprising an integrated transformer integrated into the dielectric material and electrically joined to the at least one active device, comprising the steps of a) etching first and second rows of parallel lines spaced from one another into a first copper layer to form a circuit pattern, b) applying a layer of dielectric material over the first set of parallel lines, c) creating and developing a pattern in said dielectric material to create photovias near each end of the parallel lines and to create a recess in the dielectric material, d) etching first and second rows of parallel lines spaced from one another into a second copper layer, e) connecting the first row of lines in the first copper layer through the photovias to the first row of lines in the second copper layer to form a first set of secondary windings, f) connecting the second row of lines in the first copper layer through additional photovias to the second row of lines in the second copper layer to form a second set of secondary windings, and g) introducing a transformer core into the recess between the first and second sets of windings.

\* \* \* \* \*